(12) United States Patent
Kim et al.

(10) Patent No.: US 10,749,130 B2
(45) Date of Patent: Aug. 18, 2020

(54) ELECTROLUMINESCENT DEVICE, AND DISPLAY DEVICE COMPRISING THEREOF

(71) Applicant: SAMSUNG ELECTRONICS CO., LTD., Suwon-si, Gyeonggi-do (KR)

(72) Inventors: Chan Su Kim, Seoul (KR); Tae Ho Kim, Suwon-si (KR); Kun Su Park, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/038,752

(22) Filed: Jul. 18, 2018

(65) Prior Publication Data
US 2019/0288230 A1    Sep. 19, 2019

(30) Foreign Application Priority Data

Mar. 14, 2018 (KR) .................. 10-2018-0029851

(51) Int. Cl.
*H01L 51/52* (2006.01)
*H01L 51/50* (2006.01)
*H01L 51/56* (2006.01)

(52) U.S. Cl.
CPC ...... *H01L 51/5203* (2013.01); *H01L 51/5056* (2013.01); *H01L 51/5072* (2013.01); *H01L 51/56* (2013.01)

(58) Field of Classification Search
CPC .................................................. H01L 51/5072
See application file for complete search history.

(56) References Cited

U.S. PATENT DOCUMENTS

| | | | |
|---|---|---|---|
| 7,081,234 B1 | 7/2006 | Qi et al. | |
| 7,799,495 B2 | 9/2010 | Wu et al. | |
| 9,073,752 B2 | 7/2015 | Kang et al. | |
| 9,587,172 B2 * | 3/2017 | Lee ........... | C09K 11/06 |
| 9,701,896 B2 | 7/2017 | Nick et al. | |
| 2005/0042533 A1 * | 2/2005 | Wu ............ | G03G 5/0507 430/64 |
| 2006/0057480 A1 * | 3/2006 | Lin ............ | G03G 5/142 430/65 |
| 2007/0007538 A1 * | 1/2007 | Ono ........... | H01L 51/5012 257/79 |

(Continued)

FOREIGN PATENT DOCUMENTS

| | | |
|---|---|---|
| CN | 102543464 B | 7/2014 |
| JP | 2013041758 A | 2/2013 |

(Continued)

*Primary Examiner* — Stephen M Bradley
(74) *Attorney, Agent, or Firm* — Cantor Colburn LLP

(57) ABSTRACT

An electroluminescent device comprising a first electrode; a hole transport layer disposed on the first electrode; an emission layer disposed on the hole transport layer and comprising a plurality of light emitting particles; an electron transport layer disposed on the emission layer and comprising a metal oxide particle-organic polymer composite comprising a plurality of metal oxide particles and an organic polymer; and a second electrode disposed on the electron transport layer, wherein the organic polymer is present in the metal oxide particle-organic polymer composition in an amount of about 7 weight percent to about 30 weight percent based on a total weight of the electron transport layer.

20 Claims, 11 Drawing Sheets

(56) References Cited

U.S. PATENT DOCUMENTS

| | | | |
|---|---|---|---|
| 2008/0145520 A1* | 6/2008 | Yumoto | H01L 51/0003 427/66 |
| 2014/0061592 A1* | 3/2014 | Liu | H01L 51/0067 257/40 |
| 2015/0028305 A1 | 1/2015 | Niu et al. | |
| 2016/0268526 A1 | 9/2016 | Facchetti et al. | |
| 2017/0092870 A1* | 3/2017 | Kim | H01L 51/0052 |
| 2017/0149006 A1* | 5/2017 | Park | H01L 51/5072 |
| 2018/0254421 A1* | 9/2018 | Kinge | H01L 51/426 |
| 2019/0097151 A1* | 3/2019 | Lee | H01L 51/5004 |

FOREIGN PATENT DOCUMENTS

| | | |
|---|---|---|
| JP | 5173118 B2 | 3/2013 |
| KR | 20110132165 A | 12/2011 |
| KR | 101607478 B1 | 3/2016 |
| KR | 101620870 B1 | 5/2016 |
| KR | 101641367 B1 | 7/2016 |
| KR | 20170046877 A | 5/2017 |

\* cited by examiner

ELECTROLUMINESCENT DEVICE, AND DISPLAY DEVICE COMPRISING THEREOF

CROSS-REFERENCE

This application claims priority to and the benefit of Korean Patent Application No. 10-2018-0029851 filed in the Korean Intellectual Property Office on Mar. 14, 2018, and all the benefits accruing therefrom under 35 U.S.C. § 119, the entire content of which is incorporated herein by reference.

BACKGROUND

1. Field

An electroluminescent device and a display device comprising the electroluminescent device are disclosed.

2. Description of the Related Art

Light-emitting, such as electroluminescent devices can be used to provide illumination. Light emitting devices also can be included, for example, in displays (e.g., flat-panel displays), screens (e.g., computer screens), and other items that require illumination. Accordingly, increases in the efficiency of a light-emitting device and displays are desirable.

SUMMARY

An electroluminescent device having improved luminous efficiency and life-span characteristics and a display device including the same are provided.

According to an embodiment, an electroluminescent device includes a first electrode; a hole transport layer disposed on the first electrode; an emission layer disposed on the hole transport layer and including a plurality of light emitting particles; an electron transport layer disposed on the emission layer and including a metal oxide particle-organic polymer composite including a plurality of metal oxide particles and an organic polymer; and a second electrode disposed on the electron transport layer, wherein the organic polymer is present in the metal oxide particle-organic polymer composition in an amount of about 7 weight percent to about 30 weight based on a total weight of the electron transport layer.

The plurality of metal oxide particles may be dispersed in the organic polymer.

The organic polymer is adsorbed on at least a portion of the plurality of metal oxide particles The organic polymer may include at least one of an amino-containing polymer, a hydroxy-containing polymer, a (meth)acryl-containing polymer, a derivative thereof, or a combination thereof.

The organic polymer may have a weight average molecular weight of about 1,000 grams per mole to about 30,000 grams per mole.

The plurality of metal oxide particles may include at least one of ZnO, $TiO_2$, $ZrO_2$, $SnO_2$, $W_{O3}$, $Ta_2O_3$, or a combination thereof.

An average particle diameter of a metal oxide particle of the plurality of metal oxide particles may be about 0.1 nanometers to about 10 nanometers.

A lowest unoccupied molecular orbital energy level of the electron transport layer may range from about −4.20 electron volts to about −3.5 electron volts.

A highest unoccupied molecular orbital energy level of the electron transport layer may range from about −8.0 electron volts to about −7.0 electron volts.

A bandgap energy of the electron transport layer may range from about 2.5 electron volts to about 3.8 electron volts.

A thickness of the electron transport layer may range from about 5 nanometers to about 100 nanometers.

The plurality of light emitting particles may include a plurality of quantum dots.

Each of the light emitting particles of the plurality of light emitting particles may include a Group II-VI compound that does not include Cd, a Group III-V compound, a Group IV-VI compound, a Group IV element or compound, a Group compound, a Group I-II-IV-VI compound that does not include Cd, or a combination thereof.

The light emitting particles may have a core-shell structure.

According to another embodiment, a display device includes the electroluminescent device.

An electroluminescent device may have improved luminous efficiency and life-span characteristics by preventing a leakage current and improving electron transport properties and hole inhibiting performance.

As described above, a display device including an electroluminescent device having improved luminous efficiency and life-span characteristics may be provided.

BRIEF DESCRIPTION OF THE DRAWINGS

These and/or other aspects will become apparent and more readily appreciated from the following description, taken in conjunction with the accompanying drawings in which.

DETAILED DESCRIPTION

Figure 1:
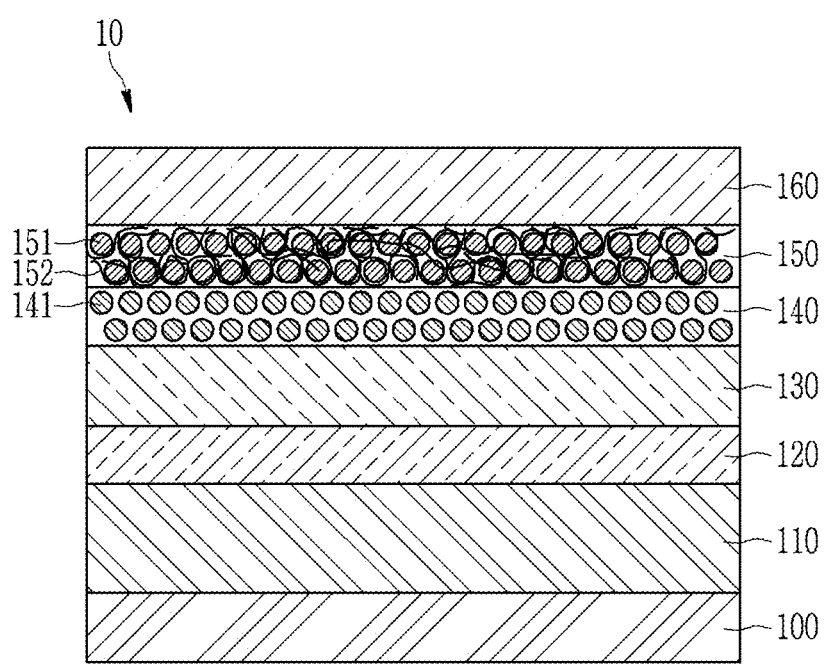
FIG. 1 is a cross-sectional view showing an electroluminescent device according to an embodiment.

Exemplary embodiments of the present disclosure will hereinafter be described in detail, examples of which are illustrated in the accompanying drawings, and may be performed by a person having an ordinary skill in the related art. In this regard, the present exemplary embodiments of this disclosure may be embodied in many different forms, and should not be construed as limited to the exemplary embodiments and descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly in contact with or on the other element or intervening elements may also be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "Group" may refer to a Group of the Periodic Table of the Elements.

As used herein, the term "metal" includes a semi-metal.

As used herein, "Group II" refers to Group IIA and Group IIB, and examples of Group II metals include Cd, Zn, Hg, and Mg, but are not limited thereto.

As used herein, of the term "Group II metal that does not include Cd" refers to a Group II metal except Cd, for example Zn, Hg, Mg, or the like.

As used herein, "Group III" refers to Group IIIA and Group IIIB, and examples of Group III metals include Al, In, Ga, and TI, but are not limited thereto.

As used herein, "Group IV" refers to Group IVA and Group IVB, and examples of a Group IV metals include Si, Ge, and Sn, but are not limited thereto. As used herein, the term "metal" includes a semi-metal such as Si.

As used herein, "Group I" refers to Group IA and Group IB, and examples of Group I metals include Li, Na, K, Rb, and Cs, but are not limited thereto.

As used herein, "Group V" refers to Group VA, and examples of Group V elements include nitrogen, phosphorus, arsenic, antimony, and bismuth, but are not limited thereto.

As used herein, "Group VI" refers to Group VIA, and examples of Group VI elements include sulfur, selenium, and tellurium, but are not limited thereto.

As used herein, the term "(meth)acrylate" may be acrylate or a (C1-C12 alkyl) methacrylate.

The particle diameter of a particle in the present disclosure, although the size may be provided by a measurement to show an average size of particles in a group of particles, the method used to determine particle size includes a mode diameter showing the maximum value of the distribution, a median diameter corresponding to the center value of integral distribution curve, a variety of average diameters (numeral average, length average, area average, mass average, volume average, etc.), and the like. Unless particularly stated otherwise, an average particle diameter means a numeral average diameter in the present disclosure, and it is obtained by measuring D50 (particle diameter at a position of distribution rate of 50%).

Quantum dots are a nanocrystal semiconductor material having a diameter of less than or equal to about 10 nanometers (nm), resulting in quantum confinement and related effects. Quantum dots generate stronger light in a narrower wavelength region than the commonly used phosphor. Quantum dots emit light while the excited electrons are transited from a conduction band to a valance band, and wavelengths can be changed depending upon a particle size of the quantum dots, even in the same material. As quantum dots emit light having a shorter wavelength because of the smaller particle size, they may provide visible light in a desirable wavelength region by adjusting the size of the quantum dots.

In an electroluminescent devices, the emission layers including quantum dots, and the corresponding electronic devices including the same, are relatively inexpensive and may generally reduce the overall production costs compared to devices having emission layers that include the organic light emitting diode and including phosphorescence and/or phosphor materials. Additionally, desirable colors may be selectively emitted by changing the size of quantum dots, without the added necessity to use other organic materials in the emission layer for emitting certain colors of light.

The luminous efficiency of the emission layer including quantum dots is determined by quantum efficiency of quantum dots, a balance of charge carriers, light extraction efficiency, a leakage current, and the like. That is, in order to improve luminous efficiency of an emission layer, methods for controlling excitons to be confined in an emission layer, smoothly transporting holes and electrons of a quantum dot, or preventing a leakage current can be used.

FIG. 1 is a schematic cross-sectional view of an electroluminescent device according to an exemplary embodiment.

An electroluminescent device 10 according to an embodiment includes a substrate 100, a first electrode 110, a hole injection layer 120 disposed on the first electrode 110, a hole transport layer 130 disposed on the hole injection layer 120, an emission layer 140 disposed on the hole transport layer 130 and including a plurality of light emitting particles 141, an electron transport layer 150 disposed on the emission layer 140 and including a metal oxide particle-organic polymer composite including a plurality of metal oxide particles 151 and an organic polymer 152, and a second electrode 160 disposed on the electron transport layer 150.

That is, the electroluminescent device 10 has a stack structure wherein the hole injection layer 120, the hole transport layer 130, the emission layer 140 and the electron transport layer 150 are disposed between the first electrode 110 and the second electrode 160 that are facing each other.

The electroluminescent device 10 according to an embodiment supplies a current to the emission layer 140 through the first electrode 110 and the second electrode 160, and causes electro-luminescence of the light emitting particles 141 to generate light. The electroluminescent device 10 may generate light in various wavelength regions corresponding to different colors according to the selected materials, sizes, or fine structures of the light emitting particles 141 of the emission layer 140.

In an embodiment, the first electrode 110 may be directly connected to a driving power source so may function to flow current to the emission layer 140. The first electrode 110 may include a material having light transmittance in at least the visible light wavelength region (ca. 350-750 nm), but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

Meanwhile, in an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate may include a cyclo olefin copolymer (COC) or a cyclo olefin polymer (COP) material.

In an embodiment, the substrate 100 may provide support to the hole injection layer 120, the transport layer 130, the emission layer 140, and the electron transport layer 150 that are disposed between the first electrode 110 and the second electrode 160. However, the first electrode 110 of the electroluminescent device 10 according to an embodiment is not necessarily disposed on the substrate 100, and in some embodiments the substrate 100 may be disposed on the second electrode 160 or may be omitted, as desired.

The second electrode 160 may include an optically transparent material and may function as a light-transmitting electrode to transmit light generated in the emission layer 140, for example to outside of the electroluminescent device. In an embodiment, the second electrode 160 may include at least one of silver (Ag), aluminum (Al), copper (Cu), gold (Au), molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, an alloy thereof, or a combination thereof.

Each of the first electrode 110 and the second electrode 160 may be formed, for example, by depositing a material for forming an electrode on the substrate 100 or another organic layer by a method such as sputtering or the like.

According to an embodiment, the hole injection layer 120 may be disposed on the first electrode 110 between the first electrode 110 and the hole transport layer 130. The hole injection layer 120 may supply holes into the emission layer 140 together with the hole transport layer 130. However, in some embodiments the hole injection layer 120 may be omitted based on the thickness and the material used for the hole transport layer 130.

The hole injection layer 120 may be formed of a p-type semiconductor material or a material that is doped with a p-type dopant. For example, the hole injection layer 120 may include a poly(3,4-ethylenedioxythiophene) (PEDOT) derivative, a poly(styrenesulfonate) (PSS) derivative, a poly-N-vinylcarbazole (PVK) derivative, a poly(p-phenylene vinylene) (PPV) derivative, a poly(meth)acrylate derivative, a poly(9,9-octylfluorene) derivative, a poly (spiro-fluorene) derivative, N,N'-diphenyl-N,N'-bis(3-methylphenyl)-(1,1'-biphenyl)-4,4'-diamine (TPD), N,N'-di (naphthalen-1-yl)-N—N'-diphenyl-benzidine) (NPB), m-MTDATA tris(3-methylphenylphenylamino)-triphenylamine) (m-MTDATA), poly(9,9'-dioctylfluorene-co-N-(4-butylphenyl)diphenylamine) (TFB), poly(9,9-dioctylfluorene)-co-N, N-diphenyl-N,N-di-(p-butylphenyl)-1,4-diaminobenzene (PFB), poly-TPD, a metal oxide such as NiO or $MoO_3$, or a combination thereof, but is not limited thereto.

The hole transport layer 130 may be disposed, for example directly disposed on the first electrode 110, between the first electrode 110 and the emission layer 140 and/or between the hole injection layer 120 and the emission layer 140. The hole transport layer 130 may provide and transport holes into the emission layer 140. The hole transport layer 130 is disposed directly under the emission layer 140 and directly contacts the emission layer 140.

In an embodiment, the hole transport layer 130 may be formed of a p-type semiconductor material or a material doped with a p-type dopant. For example, the hole transport layer 130 may include a poly (3,4-ethylenedioxythiophene) (PEDOT) derivative, a poly(styrene sulfonate) (PSS) derivative, a poly-N-vinylcarbazole (PVK) derivative, a poly(p-phenylene vinylene) (PPV) derivative, a poly(meth)acrylate derivative, a poly(9,9-octylfluorene) derivative, a poly (spiro-fluorene) derivative, N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methylphenylphenylamino)-triphenylamine) (m-MTDATA), poly(9,9'-dioctylfluorene-co-N-(4-butylphenyl)diphenylamine) (TFB), poly(9,9-dioctylfluorene)-co-N, N-diphenyl-N,N-di-(p-butylphenyl)-1,4-diaminobenzene (PFB), poly-TPD, a metal oxide such as NiO or $MoO_3$, or a combination thereof, but is not limited thereto.

This hole transport layer 130 may increase a life-span of a luminescent device and lowers a turn-on voltage when the electroluminescent device 10 starts to work (e.g., is powered on). Particularly, the hole transport layer 130 formed of a polymer material such as PEDOT, PSS, PPV, PVK, TFB, PFB, poly-TPD, and the like may have relatively strong resistance characteristics against a harmful materials such as oxygen, moisture, or the like compared with a low molecular organic material having high resistance from crystallization.

The hole transport layer 130 may be formed in a wet coating method such as spin coating and the like. For example, when the polymer such as PPV and the like is used to form a thin film on the first electrode 110, the hole transport layer 130 consisting of a PPV thin film may be obtained by spin-coating a precursor solution including a PPV precursor polymer and a methanol organic solvent on the first electrode 110 and heat-treating it, for example, under an inert gas atmosphere of $N_2$ or vacuum at about 250° C. to about 300° C. for about 3 hours.

The emission layer 140 may include at least two light emitting particles 141. The emission layer 140 is a site where electrons and holes transported by a current supplied from the first electrode 110 to the second electrode 160 are combined to generate excitons, and the generated excitons are transited from an excited state to a ground state to emit light in a wavelength corresponding to the size of the light emitting particles 141.

On the other hand, the emission layer 140 may emit light in a predetermined wavelength region. The predetermined wavelength region may belong to a visible light region, for example, one among a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, and a fifth wavelength region of about 620 nm to about 680 nm, but are not limited thereto.

In an embodiment, the light emitting particles 141 may include a plurality of quantum dots. That is, the light emitting particles 141 may consist of quantum dots, or may consist essentially of one or more quantum dots and one or more other light emitting elements, for example commercially available phosphors that are different from the quantum dots.

The quantum dots have a discontinuous energy bandgap by the quantum confinement effect and incident light may be converted into light having a particular wavelength and then emitted. When the light emitting particles 141 includes quantum dots, the emission layer 140 may produce light having excellent color reproducibility and color purity.

In an embodiment, materials of the quantum dots are not particularly limited and known or commercially available quantum dots may be used. For example, each of light emitting particles 141 according to an embodiment may include a Group II-VI compound that does not include Cd, a Group III-V compound, a Group IV-VI compound, a Group IV element or compound, a Group I-III-VI compound, a Group I-II-IV-VI compound that does not include Cd, or a combination thereof. That is, each of light emitting particles 141 according to an embodiment may be a non-cadmium-based quantum dot. Like this, when the light emitting particles 141 are quantum dots consisting of a non-cadmium-based material, it has less toxicity, for example no toxicity, compared with a conventional cadmium-based quantum dot and thus is not as dangerous to living organisms and is more environmentally-friendly.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; and a quaternary element compound such as HgZnTeS, HgZnSeS, HgZnSeTe, HgZnSTe, or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group III-V compound may further include a Group II metal (e.g., a ternary element compound such as InZnP).

The Group IV-VI compound may be a binary element compound such as SnS, SnSe, SnTe, PbS, PbSe, PbTe, or a combination thereof; a ternary element compound such asSnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof.

Examples of the Group compound include $CuInSe_2$, $CuInS_2$, CuInGaSe, CuInGaS, or a combination thereof, but are not limited thereto.

Examples of the Group I-II-IV-VI compound include CuZnSnSe, CuZnSnS, or a combination thereof, but are not limited thereto.

Examples of the Group IV compound include a single element such as Si, Ge, or a combination thereof; or a binary element compound such as SiC, SiGe, or a mixture thereof.

The binary element compound, the ternary element compound, or the quaternary element compound, respectively, may exist in a uniform concentration in the particle or in partially different concentrations in the same particle.

According to an embodiment, the light emitting particles 141 may have a core-shell structure including one semiconductor nanocrystal core and another semiconductor nanocrystal shell surrounding the core. The core and the shell may have a concentration gradient wherein the concentration of the element(s) of the shell decreases toward the core. In addition, the light emitting particles 141 may have one semiconductor nanocrystal core and multiple shells surrounding the core (i.e., a multi-layered shell structure). Herein, the multi-layered shell structure has a structure of two or more shells and each shell layer may have a single material composition, an alloy, or may have a concentration gradient.

On the other hand, when the light emitting particles 140 are quantum dots having a core-shell structure, a material composition of the shell may have a larger energy bandgap than that of the core, which may exhibit an effective quantum confinement effect.

However, the embodiments are not limited thereto. Meanwhile, in the multi-layered shell structure, a shell layer that is on an outer layer of the core-shell structure may have a higher energy bandgap than a shell layer that is nearer to the core, and light emitting particles 141 may emit light in the ultraviolet (UV) to infrared wavelength ranges.

The quantum dots may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, greater than or equal to about 99%, greater than or equal to 99.9%, or greater than or equal to 99.99%.

In a display, the emission wavelength of the quantum dots may have a relatively narrow spectrum width so as to improve color purity or color reproducibility. The quantum dots may have for example a full width at half maximum (FWHM) of a photoluminescence wavelength spectrum of less than or equal to about 45 nm, less than or equal to about 40 nm, or less than or equal to or about 30 nm. Within the ranges, color purity or color reproducibility of a device may be improved.

The quantum dots may have an average particle diameter (the longest diameter for a non-spherically shaped particle) of about 1 nm to about 100 nm. For example, the quantum dots may have an average particle diameter of about 1 nm to about 20 nm, for example, about 2 nm (or about 3 nm) to about 15 nm.

In addition, the shapes of the quantum dots may be suitable shapes, including those in this art, and thus may not be particularly limited. For example, the shape of the quantum dots may be spherical, oval, tetrahedral, pyramidal, cuboctahedral, cylindrical, polyhedral, or multi-armed; in the form of a cube nanoparticle, nanotube, nanowire, nanofiber, or nanosheet; or a combination thereof. The quantum dots may have any suitable cross-sectional shape.

The quantum dots may be commercially available or may be synthesized with any suitable method. For example, several nano-sized quantum dots may be synthesized according to a wet chemical process. In the wet chemical process, precursors react in an organic solvent to grow crystal particles, and the organic solvent or a ligand compound may coordinate the surface of the quantum dot, controlling the growth of the crystal. Examples of the organic solvent and the ligand compound may include those that are known, but are not limited thereto.

The organic solvent coordinated on the surface of the quantum dots may affect stability of a device, and thus excess organic materials that are not coordinated on the surface of the nanocrystals may be removed by pouring it in excessive non-solvent, and centrifuging the resulting mixture.

Examples of the non-solvent may be acetone, ethanol, methanol, and the like, but are not limited thereto. After the removal of excess organic materials, the amount of the organic materials coordinated on the surface of the quantum dots may be less than or equal to about 50% by weight (wt %), for example, less than or equal to about 30 wt %, less than or equal to about 20 wt %, or less than or equal to about 10 wt % based on a weight of the quantum dot.

The organic material may include a ligand compound, an organic solvent, or a combination thereof.

The quantum dots may have for example an organic ligand having a hydrophobic moiety bound to its surface. In an embodiment, the organic ligand having the hydrophobic moiety may be $RCOOH$, $RNH_2$, $R_2NH$, $R_3N$, $RSH$, $R_3PO$, $R_3P$, $ROH$, $RCOOR'$, $RP(O)(OH)_2$, $R_2P(O)OH$ (wherein, R and R' are independently a C5 to C24 alkyl group, a C5 to C24 alkenyl group, a C5 to C20 alicyclic group, or a C5 to C20 aryl group), a polymeric organic ligand, or a combination thereof. The organic ligand may be an organic ligand of a mono-functional group and the functional group may be bound to the surface of the quantum dots.

In this way, when the quantum dots have an organic ligand having a hydrophobic moiety, performance deterioration of the quantum dots due to the contact with a material for an electron transport layer (e.g., a solvent and the like) during formation of the electron transport layer 150, which will be described below, or damage to the emission layer 140 may be prevented.

In an embodiment, the electron transport layer 150 is disposed between the emission layer 140 and the second electrode 160 and thus transports electrons into the emission layer 140.

A thickness of the electron transport layer 150 may be variously selecting considering charge-carrier balance of the hole injection layer 120, the hole transport layer 130, and the emission layer 140 in the device, but may be for example greater than or equal to about 5 nanometers (nm), greater than or equal to about 10 nm, greater than or equal to about 15 nm, greater than or equal to about 20 nm, or greater than or equal to about 30 nm, and for example less than or equal to about 200 nm, less than or equal to about 150 nm, less than or equal to about 120 nm, less than or equal to about 100 nm, less than or equal to about 90 nm, less than or equal to about 80 nm, less than or equal to about 70 nm, less than or equal to about 60 nm, or less than or equal to about 50 nm, for example about 20 nm to about 200 nm, for example about 40 nm to about 150 nm, for example about 40 nm to about 120 nm.

When the electron transport layer 150 has a thickness of less than about 5 nm, the electron transport layer may not properly function as an electron transport layer as well as not satisfy the requisite charge transport properties of the electroluminescent device 10 according to an embodiment. In addition, when the electron transport layer 150 has a smaller thickness than the thickness recited above, the electron transport layer may not have a uniform thickness and be relatively easily damaged, and thus increase a leakage current.

On the other hand, when the electron transport layer 150 has a thickness of greater than about 200 nm, the electron transport layer may not adjust a charge-carrier balance with other constituent elements in the electroluminescent device 10. In other words, electrons having higher mobility than holes may pass through the emission layer 140 toward the hole transport layer 130 or the hole injection layer 120 in the electroluminescent device 10, and accordingly, a binding place of the electrons with the holes in the emission layer 140 may be concentrated toward on the interface of the emission layer 140 and the hole transport layer 130 and thus cause an exciton extinction phenomenon and the like.

In an embodiment, the electron transport layer 150 may include a metal oxide particle-organic polymer composite that includes a plurality of metal oxide particles 151 and an organic polymer 152. As shown in FIG. 1, the metal oxide particle-organic polymer composition has a structure that the metal oxide particles 151 may be entangled with and bound within the organic polymer 152.

In an embodiment, the electron transport layer 150 includes the metal oxide particle 151, the organic polymer 152, and/or one or more impurities (e.g., a residual amount of a solvent and the like). In other words, in the electron transport layer 150, the metal oxide particle 151 is well bound with the organic polymer 152 without a separate binder.

In an embodiment, the metal oxide particles 151 may bind the organic polymer 152 by adsorption, i.e. the organic polymer is adsorbed on or by the metal oxide particles. In an embodiment, the adsorption may include a physical adsorption or a chemical adsorption.

In an embodiment, the adsorption may be chemical adsorption. For example, the organic polymer 152 may have solvent selectivity regarding a polar solvent, for example solubility in the polar solvent, and thus the organic polymer 152 dissolved in the polar solvent may be chemically adsorbed by the metal oxide particle 151. For example, a hydroxy group (—OH), an amino group (—NH$_2$, —NR$_1$H, —NR$_1$R$_2$—), and the like in the organic polymer 152 may form a chemical bond (e.g., a covalent bond, a hydrogen bond, or the like) with the metal oxide particle 151.

On the other hand, in an embodiment, the metal oxide particle 151 is not tangled but is uniformly dispersed in the polar solvent. The reason is an interaction between the hydroxy group (—OH) formed on the surface of the metal oxide particle 151 and the polar solvent. Without being bound by theory, the dispersion of the metal oxide particles in the polar solvent may enhance adsorption of the organic polymer.

The polar solvent capable of respectively interacting the organic polymer 152 and the metal oxide particle 151 may include, for example, methanol, ethanol, isopropanol, butanol, or a combination thereof.

As the metal oxide particle 151 and the organic polymer 152 shows the aforementioned interaction with the polar solvent, the electron transport layer 150 including a metal oxide particle-organic polymer composite may be formed by using a suitable process, like a solution process, in the preparation of the electroluminescent device 10 according to an embodiment.

On the other hand, the metal oxide particle 151, as a constituent component of the metal oxide particle-organic polymer composite, plays a role in providing the electron transport property to the electron transport layer 150. In an embodiment, the metal oxide particle 151 may include, for example, at least one of ZnO, TiO$_2$, ZrO$_2$, SnO$_2$, WO$_3$, Ta$_2$O$_3$, or a combination thereof.

In the electroluminescent device 10, the metal oxide particle 151 may, for example, have an average particle diameter of about 1 nm to about 20 nm in order to obtain excellent electron transport efficiency and electron transport reliability.

When the metal oxide particle 151 has an average particle diameter of less than about 1 nm, sufficient electron transport properties of the electroluminescent device 10 may not be obtained. When the metal oxide particle 151 has an average particle diameter of greater than about 20 nm, a HOMO (Highest Occupied Molecular Orbital) energy level of the electron transport layer 150 may be lowered, and the electron transport layer 150 may lack a uniform surface morphology, and accordingly hole blocking property and electron transport reliability may be deteriorated.

The shape of the metal oxide particle 151 is not particularly limited, and the shape of the metal oxide particle may be spherical, oval, tetrahedral, pyramidal, cuboctahedral, cylindrical, polyhedral, multi-armed, cubic nanoparticle, or a combination thereof.

On the other hand, the organic polymer 152, as a constituent component of the metal oxide particle-organic polymer composite, may be chemically absorbed on the surface of the metal oxide particle 151 and thus minimize an internal pore, a crack, and the like of the electron transport layer 150 and uniformly control surface morphology thereof.

In an embodiment, the organic polymer 152 may include, for example, at least one of an amino-containing polymer, a hydroxy-containing polymer, a (meth)acryl-containing polymer, a derivative thereof, or a combination thereof. As used herein, an amino-containing polymer means a cyclic or aromatic nitrogen-containing vinyl polymer, any suitable polymer substituted with an amino group, or a combination thereof. As used herein, a hydroxy-containing polymer means a hydroxy-containing vinyl polymer, a phenolic polymer, any suitable polymer substituted with a hydroxy group, or a combination thereof. As used herein, a (meth)acryl-containing polymer means a (meth)acrylate polymer, a (meth)acrylic polymer, any suitable polymer substituted with a carboxylic acid, or a combination thereof. In an embodiment, the organic polymer 152 may be an amino-containing polymer. According to an embodiment, polyvinylpyrrolidone is among the amino-containing polymers that may be used.

The organic polymer 152 may interact with the metal oxide particle 151 in conjunction with the polar solvent, as described above.

On the other hand, the organic polymer 152 may be included, for example, in an amount of about 7 wt % to about 30 wt %, for example, about 10 wt % to about 30% based on a total weight of the electron transport layer 150, so that the electron transport layer 150 may show excellent device characteristics and life-span characteristics.

When the organic polymer 152 is included in an amount of less than 7 wt %, the organic polymer 152 may not be sufficient to fill an internal pore or a crack of the electron transport layer 150, and thus result in deteriorated light emitting characteristics (luminance and/or external quantum efficiency) of the electroluminescent device 10.

When the organic polymer 152 is included in an amount of greater than about 30 wt %, the organic polymer 152 may improve a hole blocking property but deteriorate an electron transport property. In other words, when the organic polymer 152 functioning as an insulator is included in excess of what is suitable, the organic polymer may increase the resistance of the electron transport layer and thus strengthen its insulation layer characteristics. Without being bound by theory, since electrons are not smoothly transported, a device may have performance deterioration or not function, and accordingly, light emitting characteristics of the device may be deteriorated or absent.

In an embodiment, the organic polymer 152 may have a weight average molecular weight variously selected by considering a content of the organic polymer 152, a size and material of the metal oxide particle 151, the desired electron mobility of the electron transport layer 150, a general charge-carrier balance of the electroluminescent device 10, and the like.

However, when the organic polymer 152 is included in the aforementioned amount in the electron transport layer 150, the organic polymer 152 may have, for example, a weight average molecular weight of about 1,000 grams per mole (g/mol) to about 30,000 g/mol.

When the organic polymer 152 has a weight average molecular weight within the above range, the electron transport layer 150 of the electroluminescent device 10 according to an embodiment may show excellent electron transport properties and hole blocking performance. Particularly, when the organic polymer includes functionalities such as amino groups, carboxylic acid groups, hydroxyl groups, and the like are used, the electron transport layer 150 may show excellent surface morphology and fewer internal pores and cracks.

In an embodiment, the electron transport layer 150 may, for example, have a lowest unoccupied molecular orbital (LUMO) energy level of about −4.20 electron volts (eV) to about −3.5 eV, for example, about −4.15 eV to about −3.0 eV.

In an embodiment, the electron transport layer 150 may, for example, have a highest occupied molecular orbital (HOMO) energy level of about −8.0 eV to about −7.0 eV.

On the other hand, in an embodiment, the electron transport layer 150 may, for example, have bandgap energy of about 2.5 eV to about 3.8 eV.

In an embodiment, when the electron transport layer 150 has an energy level and bandgap energy respectively within the above ranges, the electroluminescent device 10 may have excellent hole blocking property and electron transport property, simultaneously. It will be illustrated in detail in Experimental Examples which will be described later.

When ZnO particles are used as an inorganic electron transport layer material, the particles may have a plurality of hydroxide groups (—OH) on the surface and may be agglomerated at room temperature.

Figure 4:
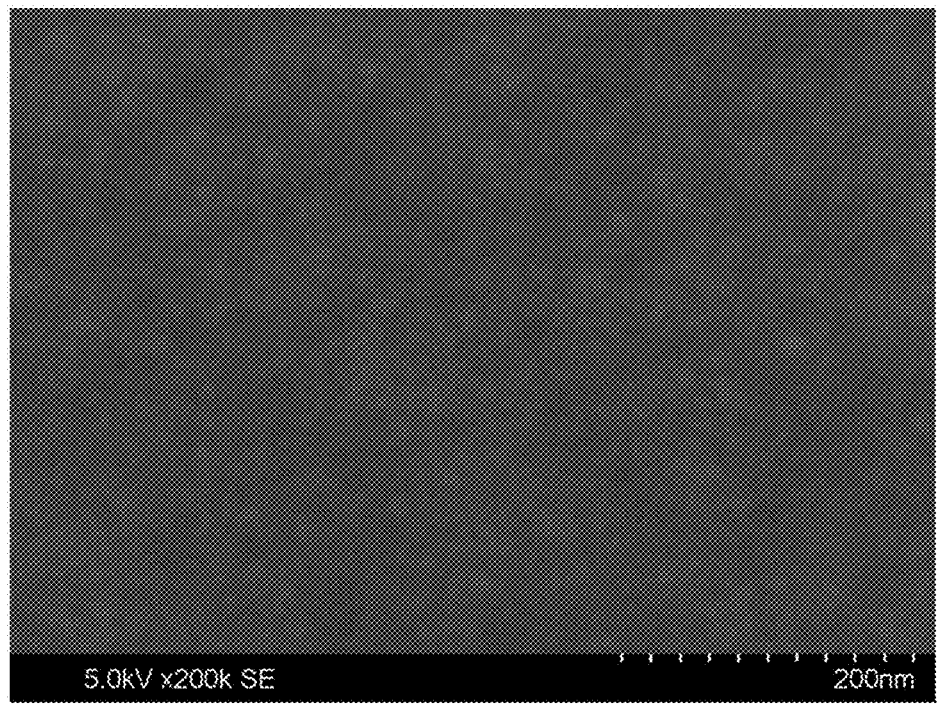

Accordingly, when these ZnO particles are used to form a ZnO cluster layer, the ZnO cluster layer shows unsatisfactory surface characteristics due to the agglomeration of the ZnO particles and has surface defects, for examples as shown in FIG. 4, and thus relatively unsatisfactory surface morphology.

These surface defects and the like may function as a leakage path of electrons during the electron transport and thus cause driving efficiency deterioration of a device such as an exciton extinction phenomenon, a leakage current, an unsmooth transport of electrons to an emission layer, and the like.

Figure 2:
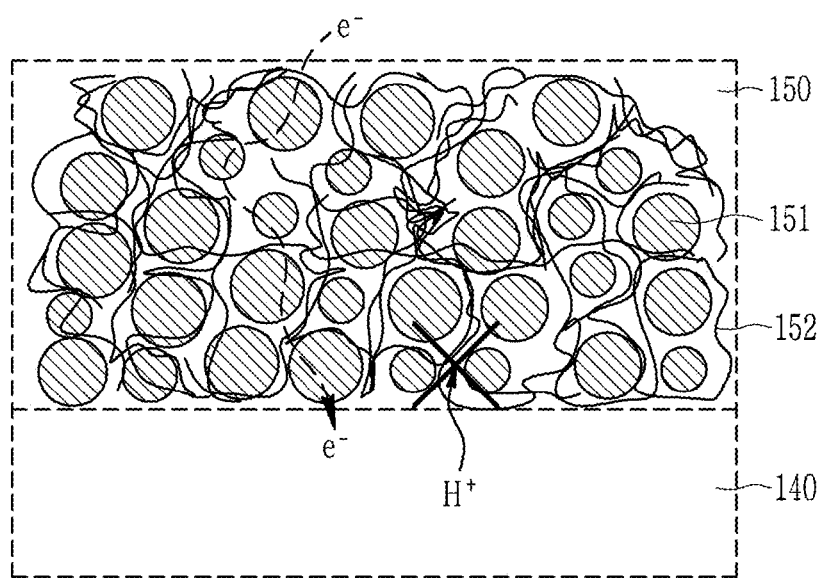
FIG. 2 is a cross-sectional view showing a function of an electron transport layer according to an embodiment.

FIG. 2 is a schematic cross-sectional view showing a function of an electron transport layer according to an embodiment.

Referring to FIGS. 1 and 2, as for the electroluminescent device 10 according to an embodiment, the metal oxide particles 151 may be dispersed, for example uniformly dispersed, in the organic polymer through the electron transport layer 150 as a metal oxide-organic polymer composite, wherein at least a portion of a space between at least some of the adjacent metal oxide particles 151 may be effectively filled by the organic polymer 152. In an embodiment, the metal oxide particles 151 may be dispersed, for example uniformly dispersed, in a polymer matrix comprising the organic polymer.

Accordingly, electrons (e$^-$) supplied in the electron transport layer 150 are neither leaked through other paths nor extinct but supplied toward the emission layer 140, as shown in FIG. 2. In addition, holes (H$^+$) present at the emission layer 140 may not move toward the electron transport layer 150, as shown in FIG. 2, due to minimization of an internal pore or a crack in the electron transport layer 150 and a high HOMO energy difference between the emission layer 140 and the electron transport layer 150 but remain in the emission layer 140.

Accordingly, the surface of the electron transport layer 150 formed of an oxide-organic polymer composite according to an embodiment shows excellent surface morphology compared with that of a ZnO cluster layer, through which a leakage path of the electrons may be minimized, and movement of the holes may be effectively blocked.

In this way, the electroluminescent device 10 according to an embodiment may accomplish improvement of luminous efficiency and life-span characteristics through the electron transport layer 150 including a metal oxide particle-organic polymer composite.

The electron transport layer 150 may be formed by using a solution process, for example, a wet coating method such as spin coating and the like. On the other hand, as for the electroluminescent device 10 according to an embodiment, the electron transport layer 150 and the emission layer 140 may be formed together, or the hole transport layer 130 and emission layer 140 together may be formed by using the solution process.

For example, the hole transport layer 130, the emission layer 140, and the electron transport layer 150 may be formed together by layering a composition for a hole transport layer, a composition for an emission layer thereon, and a composition for an electron transport layer which includes a metal oxide particle-organic polymer composite in a polar solvent thereon, and then, heat-treating the resulting stacked structure, for example, under an inert gas atmosphere (e.g., $N_2$) or under vacuum, to obtain the respective layers.

In this way, as for the electroluminescent device 10 according to an embodiment, the hole transport layer 130, the emission layer 140, and the electron transport layer 150 may be formed by using a solution process.

However, embodiments re not limited thereto, and the hole transport layer 130, the emission layer 140, and the electron transport layer 150 may be respectively formed individually depending on each material through separate processes.

In another embodiment (not shown), an electron injection layer for easing the injection of electrons and/or a hole blocking layer for blocking the movement of holes may be further disposed between the electron transport layer 150 and the second electrode 160.

The electron injection layer and the hole blocking layer each may have a desirably selected thickness. For example, each thickness may be in a range of greater than or equal to about 1 nm and less than or equal to about 500 nm but is not limited thereto. The electron injection layer may be an organic layer formed through deposition but may be omitted considering a thickness, a material, and the like of the electron transport layer 150 and the second electrode 160.

The electron injection layer may include, for example, at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), 8-(4-(4,6-di(naphthalen-2-yl)-1,3,5-triazin-2-yl)phenyl)quinolone (ET204), or a combination thereof, but is not limited thereto.

The hole blocking layer may include, for example, at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof and may be omitted considering thicknesses, materials, and the like of other constituent elements of the electroluminescent device 10.

As described above, the electroluminescent device 10 according to an embodiment includes the electron transport layer 150 formed of a metal oxide particle-organic polymer composite that includes a plurality of metal oxide particles 151 and an organic polymer 152, wherein an amount of the organic polymer 152 in the composite may be adjusted within a range of about 7 wt % to about 30 wt % based on a total weight of the electron transport layer 150.

Accordingly, the electroluminescent device 10 according to an embodiment may minimize a leakage path of electrons through the electron transport layer 150 and effectively block movement of holes toward the electron transport layer 150 and as a result, have improved luminous efficiency and life-span characteristics.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices may have the same structure as the electroluminescent device 10 and the wavelengths of the light emitted from each of the respective quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

One of the first to third electroluminescent devices may be the electroluminescent device 10. In this case, the third electroluminescent device displaying at least blue may be desirably the electroluminescent device 10.

In the display device according to an embodiment, a hole injection layer, a hole transport layer, an electron transport layer, an electron injection layer, and a hole blocking layer except an emission layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, it includes a cycloolefin copolymer (COC) or cycloolefin polymer (COP) material. Each of the first to third electroluminescent devices are formed on the substrate. That is, a substrate of the display device according to an embodiment provides a common layer for the three devices.

The driving circuit may be disposed on the substrate and is independently connected to each of the first to third electroluminescent devices. The driving circuit may include at least one line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, a display device according to an embodiment may prevent a leakage current and improve electron transport properties and thus show excellent photoluminescence characteristics.

Hereinafter, the embodiments are illustrated in more detail with reference to examples. However, these examples are exemplary, and the present disclosure is not limited thereto.

EXAMPLES

Example 1

An indium-tin oxide (ITO) layer is deposited on a glass substrate, a hole injection layer (HIL) is formed thereon by depositing poly(3,4-ethylenedioxythiophene and poly(styrenesulfonate) (PEDOT:PSS) to a thickness of about 60 nm, and then, a hole transport layer (HTL) is formed thereon by depositing a composition including 0.7 wt % of poly(9,9'-dioctylfluorene-co-N-(4-butylphenyl)diphenylamine) (TFB) (Sumitomo Corp.) in o-xylene to a thickness of 25 nm, and heating the resulting stack at a high temperature.

Subsequently, a 25 nm-thick blue emission layer is formed on the hole transport layer by coating a composition for an emission layer in which blue quantum dots coated with a dodecanethiol ligand are dispersed in octane and then heated at 80° C. The blue emission layer emits blue light having a central wavelength ranging from 452 nm to 458 nm and a full width at half maximum (FWHM) ranging from 20 nm to 28 nm.

Separately, 10 milligrams per milliliter (mg/mL) to 100 mg/mL of ZnO particles (having an average particle diameter of 3 nm to 7 nm) are dispersed in ethanol and combined with polyvinylpyrrolidone (PVP) (having a weight average molecular weight of about 10,000 g/mol) at room temperature (ca. 25° C.) in a predetermined ratio to prepare a ZnO—PVP composition in which the ZnO particles and the polyvinylpyrrolidone are dispersed in ethanol.

Then, the ZnO—PVP composition is coated to a thickness of 40 nm on the blue emission layer and heated at 80° C. for 10 to 100 minutes to form an electron transport layer with a ZnO—PVP composite. 10 wt % of PVP is included in the ZnO—PVP composite layer. For convenience, an electron transport layer having a ZnO—PVP composite is referred to herein as a ZnO—PVP composite layer.

Subsequently, an aluminum (Al) layer is deposited to a thickness of about 90 nm on the ZnO—PVP composite layer and thus to fabricate an electroluminescent device according to Example 1.

Example 2

An electroluminescent device according to Example 2 is fabricated according to the same method as Example 1 except for preparing the composition for a ZnO—PVP composite layer to include 15 wt % of PVP in a ZnO—PVP composite layer.

Example 3

An electroluminescent device according to Example 2 is fabricated according to the same method as Example 1 except for preparing the composition for a ZnO—PVP composite layer to include 25 wt % of PVP in a ZnO—PVP composite layer.

Comparative Example 1

An electroluminescent device is fabricated according to the same method as Example 1 except for preparing a composition for a ZnO cluster layer by dispersing ZnO particles having an average particle diameter of 4.5 nm in ethanol instead of using the composition for a ZnO—PVP composite layer. The electroluminescent device according to Comparative Example 1 does not include PVP.

Comparative Example 2

An electroluminescent device is fabricated according to the same method as Example 1 except for preparing the composition for a ZnO—PVP composite layer to include 5 wt % of PVP in a ZnO—PVP composite layer.

Comparative Example 3

An electroluminescent device is fabricated according to the same method as Example 1 except for using PVP having a weight average molecular weight of 50,000 g/mol.

Comparative Example 4

An electroluminescent device is fabricated according to the same method as Example 1 except for preparing the composition for a ZnO—PVP composite layer to include 40 wt % of PVP having a weight average molecular weight of 10,000 g/mol in a ZnO—PVP composite layer.

Evaluation 1: Energy Level of Composition for Electron Transport Layer

A LUMO energy level, a HOMO energy level, and bandgap energy of each composition for an electron transport layer (a composition for a ZnO—PVP composite layer or a composition for a ZnO cluster layer) during fabrication of the electroluminescent devices according to Examples 2 and 3 and Comparative Examples 1 and 2 are measured by using a spectrophotometer (U-3310, Hitach High Technologies Corp.) and ultraviolet photoelectron spectroscopy (UPS), and the results are shown in Table 1.

TABLE 1

|  | LUMO | HOMO | Bandgap energy |
|---|---|---|---|
| Example 1 | −4.08 eV | −7.24 eV | 3.16 eV |
| Example 2 | −4.09 eV | −7.23 eV | 3.13 eV |
| Comparative Example 1 | −4.18 eV | −7.54 eV | 3.36 eV |
| Comparative Example 2 | −4.05 eV | −7.35 eV | 3.30 eV |

Referring to Table 1, the compositions for a ZnO—PVP composite layer according to Examples 1 and 2 show about 0.1 eV higher LUMO energy level and about 0.3 eV higher HOMO energy level than those the composition for a ZnO cluster layer including no PVP according to Comparative Example 1. Accordingly, a ZnO—PVP composite layer may be respectively formed of the compositions but show similar electron transport properties to those of a ZnO cluster layer. In other words, PVP is included the ZnO—PVP composite layer and increases its LUMO energy level, but since the LUMO energy level is not sufficiently high enough to work as an energy barrier, the ZnO—PVP composite layer has similarly excellent electron transport properties to those of the ZnO cluster layer.

On the contrary, from a point when a HOMO energy level is increased to three-times greater than the LUMO energy level due to formation of the ZnO—PVP composite layer, the ZnO—PVP composite layer has excellent hole blocking properties compared with a ZnO cluster layer.

On the other hand, the compositions for a ZnO—PVP composite layer according to Examples 1 and 2 have a similar LUMO energy level to that of the ZnO—PVP composite layer according to Comparative Example 2 (about 0.5 eV of a difference) but about 0.11 eV to 0.12 eV increased HOMO energy level.

Accordingly, Examples 1 and 2 have similar electron transport properties to those of Comparative Example 2 but better hole blocking properties compared with those of Comparative Example 2.

Evaluation 2: Surface Morphology of Upper Surface of Electron Transport Layer

Figure 3:
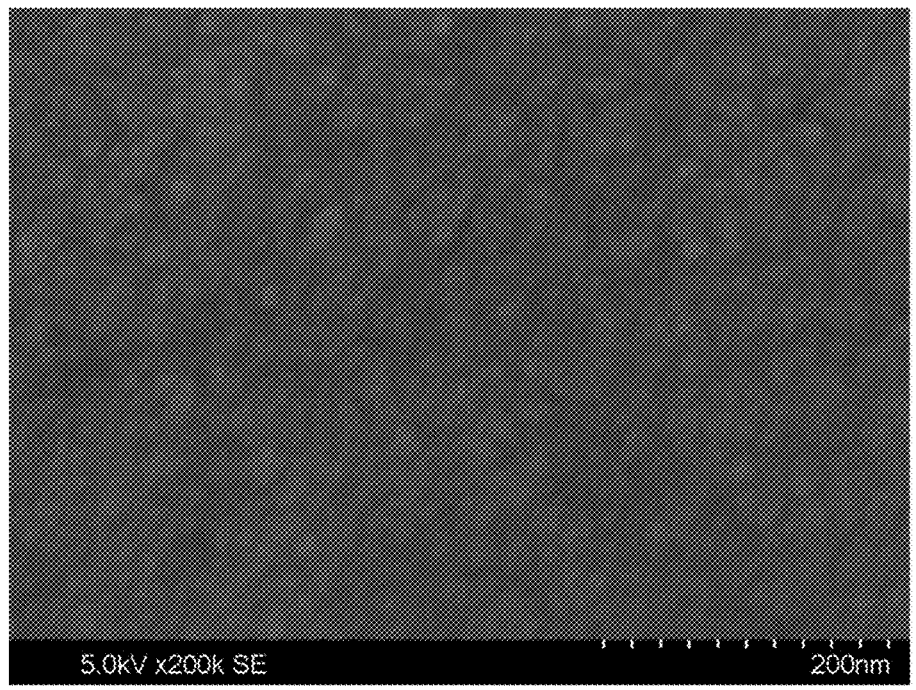
FIGS. 3 to 5 are scanning electron microscope (SEM) images showing the upper surface of an electron transport layer of each electroluminescent device according to Examples 2 and 3 and Comparative Example 2, respectively.
Figure 5:
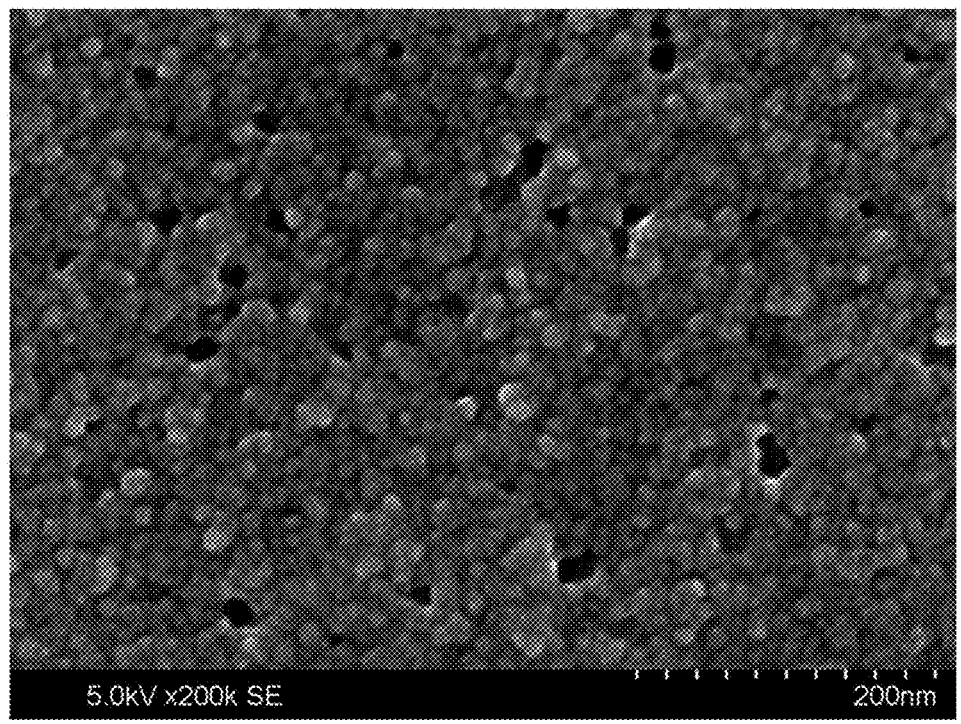

A surface image of each electron transport layer before depositing an Al layer after forming an electron transport layer (a ZnO—PVP composite layer or a ZnO cluster layer) during formation of the electroluminescent devices according to Examples 2 and 3 and Comparative Example 2 is measured, and the results are shown in FIGS. 3 to 5.

FIGS. 3 to 5 are scanning electron microscope images (SEM) showing the upper surface of each electron transport layer of the electroluminescent devices according to Examples 2 and 3 and Comparative Example 2.

Referring to FIGS. 3 and 4, in each electron transport layer of the electroluminescent devices according to Examples 2 and 3, ZnO particles are covered with PVP. Since Example 3 includes PVP in an increased content ratio compared with Example 2, a space among adjacent ZnO particles is further filled with PVP, and thus the inter-particle void is not found in the image.

Each electron transport layer of the electroluminescent devices according to Examples 2 and 3 substantially shows neither a surface crack nor a pore, which may be confirmed from FIGS. 3 and 4.

On the contrary, referring to FIG. 5, in the electron transport layer of the electroluminescent device according to Comparative Example 1, ZnO particles are dominantly agglomerated one another, and PVP is partly filled among the adjacent ZnO particles unlike FIGS. 3 and 4. Accordingly, FIG. 5 shows that an abundance of surface cracks or pores are present.

Accordingly, in order to provide an electroluminescent device showing excellent luminous efficiency and life-span characteristics, at least 5 wt % of PVP should be included in the electron transport layer.

Figure 7:
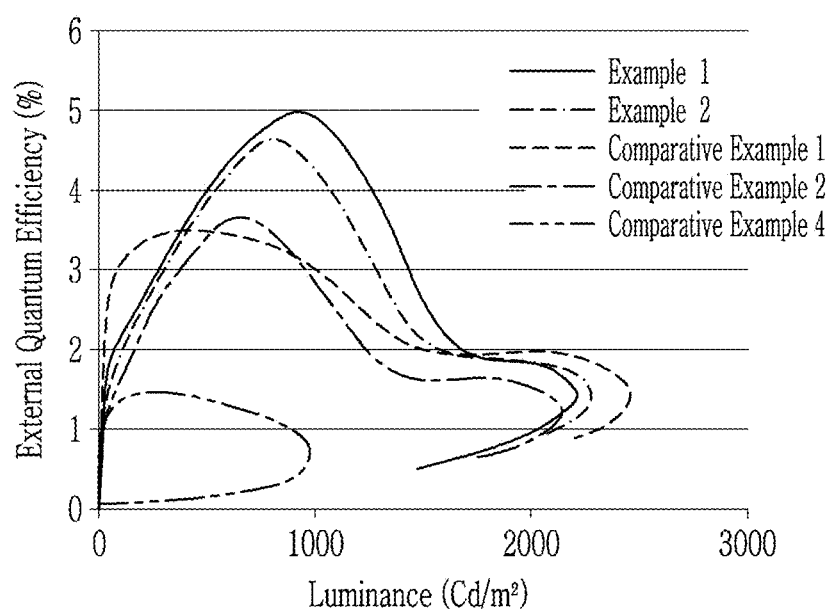
FIG. 7 is a graph of external quantum efficiency (EQE, %) versus luminance (candela per square meter, $Cd/m^2$) showing external quantum efficiency (EQE) depending on luminance of each electroluminescent device according to Examples 1 and 2 and Comparative Examples 1, 2, and 4.
Figure 8:
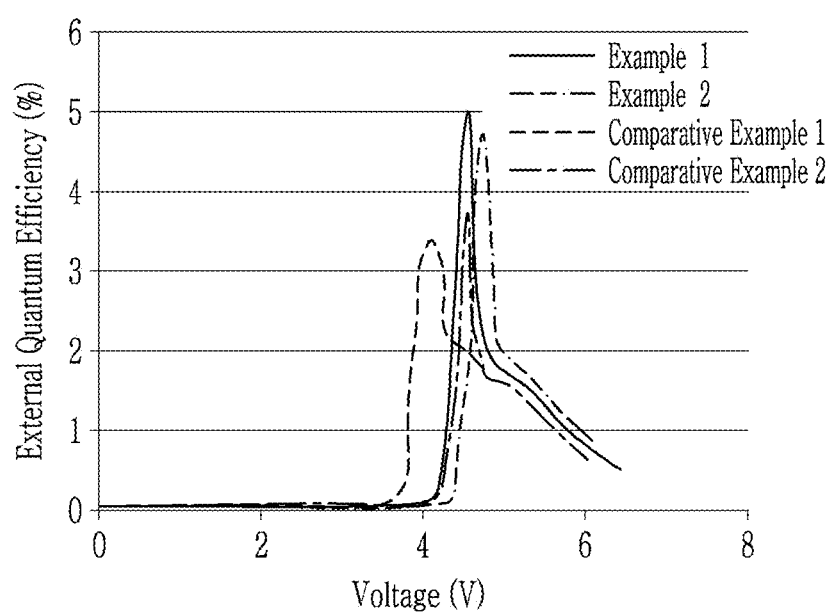
FIG. 8 is a graph of EQE (%) versus voltage (volts, V) showing external quantum efficiency depending on a voltage of each electroluminescent device according to Examples 1 and 2 and Comparative Examples 1 and 2.

Evaluation 3: Device Characteristics of Electroluminescent Device Depending on PVP Content Life-span characteristics of the electroluminescent devices according to Example 2 and Comparative Examples 1 and 2 are shown in FIG. 6, external quantum efficiency characteristics depending on luminance of the electroluminescent devices according to Examples 1 and 2 and Comparative Examples 1, 2, and 4 are shown in FIG. 7, and external quantum efficiency (EQE) characteristics depending on a voltage of the electroluminescent devices according to Examples 1 and 2 and Comparative Examples 1 and 2 are shown in FIG. 8.

Figure 6:
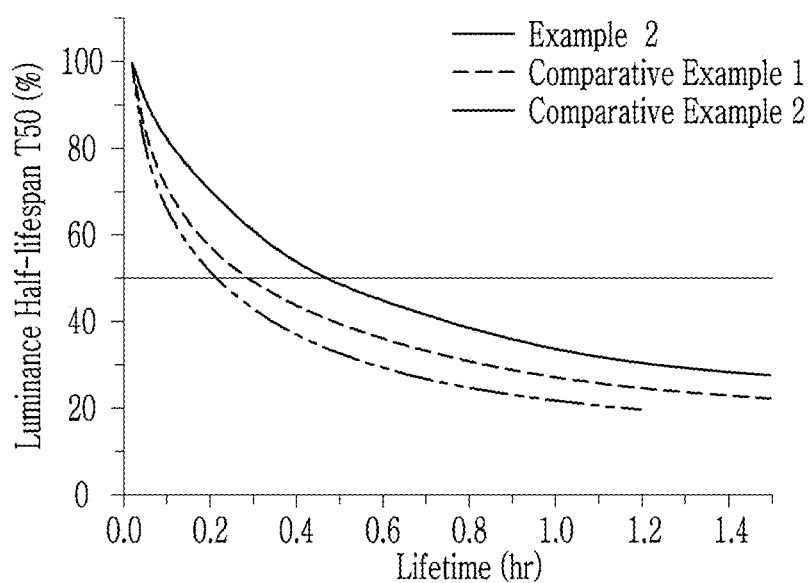
FIG. 6 is a graph of luminance half-lifespan T50(%) versus lifetime (hours, hr) showing life-span characteristics of each electroluminescent device according to Example 2 and Comparative Examples 1 and 2.

FIG. 6 is a graph showing life-span characteristics of the electroluminescent devices according to Example 2 and Comparative Examples 1 and 2.

Referring to FIG. 6, the luminance half-lifespan (T50) is provided and refers to a time that it took for the luminance to decrease 50% with respect to the initial luminance. The resulting luminance half-lifespans (T50) of the electroluminescent devices according to Example 2 and Comparative Examples 1 and 2 are respectively about 0.45 hours, about 0.2 hours, about 0.3 hours. Accordingly, an electroluminescent device not including PVP shows a remarkably shorter half lifespan T50, and even though it includes PVP in an amount of 5 wt %, an effect of improving a half lifespan T50 of the electroluminescent device is minimal.

On the other hand, an electroluminescent device including 15 wt % of PVP shows about 1.5 to 2 times improved half lifespan T50 compared with that of the electroluminescent devices according to the Comparative Examples, and the reason is that a surface crack, a pore, and the like of an electron transport layer is minimized by sufficiently filling a space among adjacent ZnO particles with PVP.

FIG. 7 is a graph showing external quantum efficiency (EQE) depending on luminance of each electroluminescent device according to Examples 1 and 2 and Comparative Examples 1, 2, and 4.

Referring to FIG. 7, the electroluminescent devices according to Examples 1 and 2 show respectively about 4.94% and 4.64% of maximum external quantum efficiency compared with 3.32% (Comparative Example 1), 3.64% (Comparative Example 2), about 1.4% (Comparative Example 4).

On the other hand, with a reference to 100 Cd/m$^2$ of luminance, the electroluminescent devices including PVP (Examples 1 and 2 and Comparative Example 2) show a slightly decreased external quantum efficiency compared with the electroluminescent device (Comparative Example 1), but the electroluminescent device including greater than or equal to 7 wt % of PVP according to example embodiments shows increased external quantum efficiency compared with the electroluminescent devices including 5 wt % of PVP (Comparative Example 2) and 40 wt % of PVP (Comparative Example 4).

On the other hand, with a reference to a general luminance section ranging from about 500 Cd/m$^2$ to 1800 Cd/m$^2$, example embodiments including greater than or equal to 7 wt % of PVP show excellent external quantum efficiency compared with Comparative Examples.

FIG. 8 is a graph showing external quantum efficiency depending on a voltage of the electroluminescent devices according to Examples 1 and 2 and Comparative Examples 1 and 2.

Referring to FIG. 8, example embodiments and Comparative Example 2 including PVP show a slightly increased initial voltage compared with Comparative Example 1 not including PVP at all, but an initial voltage difference between example embodiments and Comparative Example 2 seems insignificant. On the other hand, a voltage at which maximum external quantum efficiency is realized also increases in order of Comparative Example 1, Comparative Example 2, Example 1, and Example 2. The reason is that an amount of PVP, which is an insulator having a weak electron transport property, is increased compared with that of ZnO.

However, example embodiments show considerably increased maximum external quantum efficiency as shown in FIG. 8 but not a substantial difference in terms of a required voltage within a suppliable range from an actual driving power source compared with Comparative Examples. Accordingly, an external quantum efficiency increase effect is remarkable, compared with an initial voltage increase when PVP is included in an amount of greater than or equal to 7 wt %.

Evaluation 4: Device Characteristics of Electroluminescent Device Depending on PVP Weight Average Molecular Weight The luminance half lifespan T50 characteristics, external quantum efficiency characteristics depending on luminance, and external quantum efficiency characteristics depending on a voltage of each electroluminescent device according to Example 1 and Comparative Examples 1 and 3 are shown in FIGS. 9 to 11.

Figure 9:
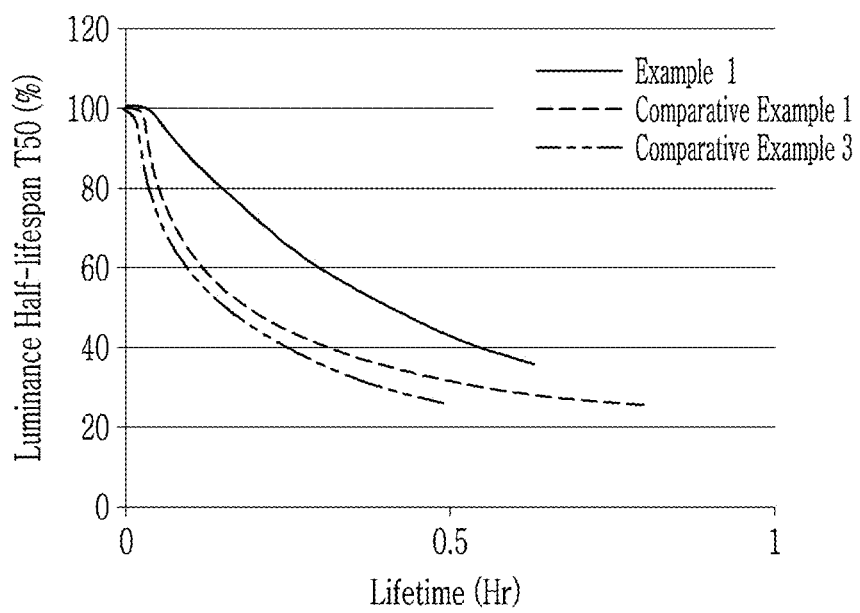
FIG. 9 is a graph of luminance half-lifespan T50(%) versus lifetime (hr) showing life-span characteristics of each electroluminescent device according to Example 1 and Comparative Examples 1 and 3.

FIG. 9 is a graph showing half lifespan T50 characteristics of the electroluminescent devices according to Example 1 and Comparative Examples 1 and 3.

Referring to FIG. 9, the half lifespan T50 of when the electroluminescent devices according to Example 1 and Comparative Examples 1 and 3 emit light at a 50% level of initial luminance are respectively about 0.45 hour, about 0.2 hour, and about 0.17 hour. Accordingly, the electroluminescent devices have different life-span characteristics depending on a change of a weight average molecular weight. Particularly, since Example 1 having a weight average molecular weight of 10,000 g/mol shows deteriorated life-span characteristics compared with Comparative Example 3 having a weight average molecular weight of 50,000 g/mol, an electroluminescent device having excellent device characteristics may be obtained by controlling PVP within an appropriate weight average molecular weight range to be included within an appropriate amount.

Figure 10:
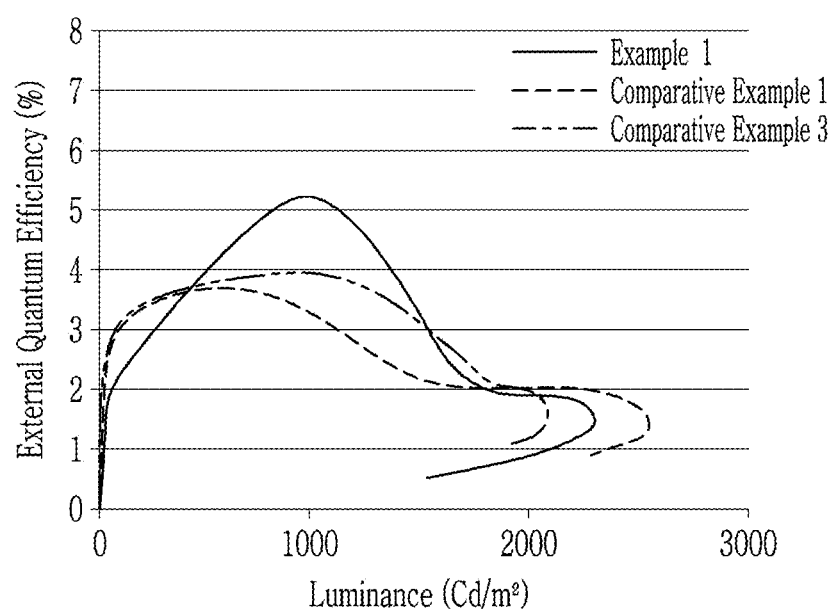
FIG. 10 is a graph of EQE (%) versus luminance ($Cd/m^2$) showing external quantum efficiency (EQE) depending on luminance of each electroluminescent device according to Example 1 and Comparative Examples 1 and 3.
Figure 11:
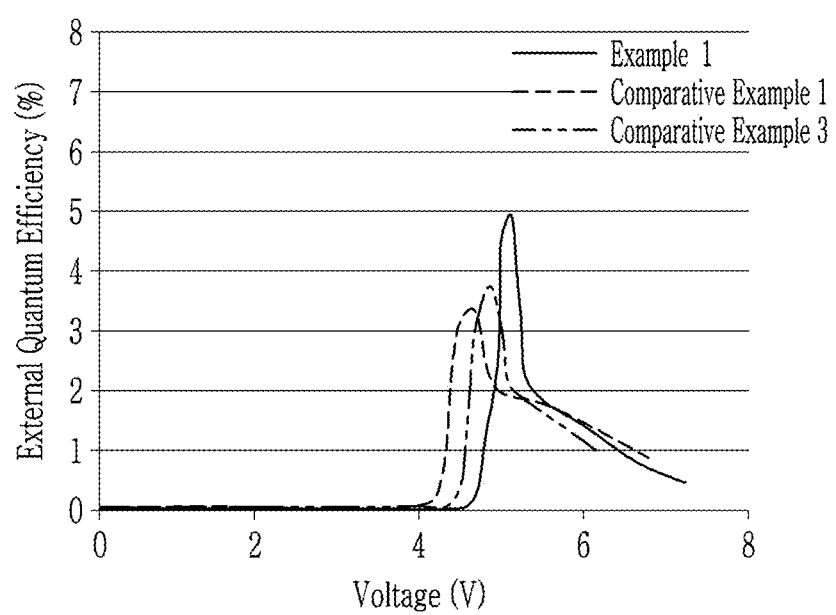
FIG. 11 is a graph of EQE (%) versus voltage (V) showing external quantum efficiency depending on a voltage of each electroluminescent device according to Example 1 and Comparative Examples 1 and 3.

FIG. 10 is a graph showing external quantum efficiency (EQE) depending on luminance of the electroluminescent devices according to Example 1 and Comparative Examples 1 and 3.

Referring to FIG. 10, Comparative Example 3 using PVP having a weight average molecular weight of 50,000 g/mol under a low luminance condition of 100 Cd/m$^2$ shows nearly identical external quantum efficiency to that of Comparative Example 1 not including PVP. However, Comparative Example 3 shows similar maximum external quantum efficiency to that of Comparative Example 1.

On the other hand, Example 1 shows a lower external quantum efficiency under a low luminance condition of 100 Cd/m$^2$ compared with the Comparative Examples, but has excellent maximum external quantum efficiency and external quantum efficiency within a general luminance section of about 500 Cd/m² to 1800 Cd/m² compared with the Comparative Examples.

Accordingly, an electroluminescent device having excellent device characteristics may be obtained by controlling PVP within an appropriate weight average molecular weight range to be included within an appropriate amount.

FIG. 11 is a graph showing external quantum efficiency depending on a voltage of the electroluminescent devices according to Example 1 and Comparative Examples 1 and 3.

Referring to FIG. 11, Example 1 shows an increased initial voltage and voltage at which maximum external quantum efficiency is realized, and considerably high maximum external quantum efficiency. Accordingly, an electroluminescent device having excellent device characteristics may be obtained by controlling PVP within an appropriate weight average molecular weight range to be included within an appropriate amount.

Therefore, an electroluminescent device having an improved luminous efficiency and life-span characteristics may be provided by using an electron transport layer formed of a metal oxide particle-organic polymer composite according to an embodiment.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device comprising
a first electrode;
a hole transport layer disposed on the first electrode;
an emission layer disposed on the hole transport layer and comprising a plurality of light emitting particles;
an electron transport layer disposed on the emission layer and comprising a metal oxide particle-organic polymer composite comprising a plurality of metal oxide particles and an organic polymer; and
a second electrode disposed on the electron transport layer,
wherein the organic polymer is present in the metal oxide particle-organic polymer composite in an amount of about 10 weight percent to about 25 weight percent based on a total weight of the electron transport layer.

2. The electroluminescent device of claim 1, wherein the plurality of metal oxide particles are dispersed in the organic polymer.

3. The electroluminescent device of claim 1, wherein the organic polymer is adsorbed on at least a portion of the plurality of metal oxide particles.

4. The electroluminescent device of claim 1, wherein the organic polymer comprises at least one of an amino-containing polymer, compound, a hydroxy-containing polymer, a (meth)acryl-containing polymer, a derivative thereof, or a combination thereof.

5. The electroluminescent device of claim 1, wherein the organic polymer has a weight average molecular weight of about 1,000 grams per mole to about 30,000 grams per mole.

6. The electroluminescent device of claim 1, wherein the plurality of metal oxide particle comprise at least one of $ZnO$, $TiO_2$, $ZrO_2$, $SnO_2$, $WO_3$, $Ta_2O_3$, or a combination thereof.

7. The electroluminescent device of claim 1, wherein an average particle diameter of a metal oxide particle of the plurality of metal oxide particles is about 0.1 nanometers to about 10 nanometers.

8. The electroluminescent device of claim 1, wherein a lowest unoccupied molecular orbital energy level of the electron transport layer ranges from about −4.20 electron volts to about −3.5 electron volts.

9. The electroluminescent device of claim 1, wherein a highest unoccupied molecular orbital energy level of the electron transport layer ranges from about −8.0 electron volts to about −7.0 electron volts.

10. The electroluminescent device of claim 1, wherein a bandgap energy of the electron transport layer ranges from about 2.5 electron volts to about 3.8 electron volts.

11. The electroluminescent device of claim 1, wherein a thickness of the electron transport layer ranges from about 5 nanometers to about 100 nanometers.

12. The electroluminescent device of claim 1, wherein the plurality of light emitting particles comprises a plurality of quantum dots.

13. The electroluminescent device of claim 1, wherein each light emitting particle of the plurality of light emitting particles comprises a Group II-VI compound that does not comprise Cd, a Group III-V compound, a Group IV-VI compound, a Group IV element or compound, a Group I-III-VI compound, a Group I-II-IV-VI compound that does not comprise Cd, or a combination thereof.

14. The electroluminescent device of claim 1, wherein the light emitting particle has a core-shell structure.

15. A display device comprising the electroluminescent device of claim 1.

16. A method of manufacturing a display device, comprising:
providing a first electrode;
disposing a hole transport layer on the first electrode;
disposing an emission layer on the hole transport layer, wherein the emission layer comprises a plurality of light emitting particles;
disposing an electron transport layer on the emission layer, wherein the electron transport layer comprises a metal oxide particle-organic polymer composite comprising a plurality of metal oxide particles and an organic polymer; and
disposing a second electrode on the electron transport layer,
wherein the organic polymer is included in metal oxide particle-organic polymer composite in an amount of about 10 weight percent to about 25 weight percent based on a total weight of the electron transport layer.

17. The method of claim 16, wherein the disposing of the electron transport layer comprises
combining the plurality of metal oxide particles and the organic polymer in a polar solvent to form a metal oxide particle-organic polymer composition;
coating the metal oxide particle-organic polymer composition on the emission layer; and
forming the metal oxide particle-organic polymer composite.

18. The method of claim 17, wherein the forming comprises heating the metal oxide particle-organic polymer composition to provide the metal oxide particle-organic polymer composite.

19. The method of claim 17, further comprising adsorbing the organic polymer on at least a portion of the plurality of metal oxide particles.

20. The method of claim 17, wherein the polar solvent comprises methanol, ethanol, isopropanol, butanol, or a combination thereof.

\* \* \* \* \*